(12) United States Patent
Maeda et al.

(10) Patent No.: US 12,009,638 B2
(45) Date of Patent: Jun. 11, 2024

(54) SURFACE EMISSION LASER DRIVING METHOD AND SURFACE EMISSION LASER DEVICE

(71) Applicant: Sony Semiconductor Solutions Corporation, Kanagawa (JP)

(72) Inventors: Osamu Maeda, Kanagawa (JP); Shota Watanabe, Kanagawa (JP); Motoi Kimura, Kanagawa (JP); Jugo Mitomo, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 633 days.

(21) Appl. No.: 17/286,540

(22) PCT Filed: Oct. 29, 2019

(86) PCT No.: PCT/JP2019/042341
§ 371 (c)(1),
(2) Date: Apr. 19, 2021

(87) PCT Pub. No.: WO2020/100572
PCT Pub. Date: May 22, 2020

(65) Prior Publication Data
US 2021/0384710 A1 Dec. 9, 2021

(30) Foreign Application Priority Data
Nov. 16, 2018 (JP) ................. 2018-215382

(51) Int. Cl.
*H01S 5/42* (2006.01)
*H01S 5/042* (2006.01)
*H01S 5/0683* (2006.01)

(52) U.S. Cl.
CPC ............ *H01S 5/42* (2013.01); *H01S 5/06835* (2013.01); *H01S 5/04256* (2019.08)

(58) Field of Classification Search
None
See application file for complete search history.

(56) References Cited

U.S. PATENT DOCUMENTS

| 5,404,367 A | 4/1995 | Auyeung et al. |
| 2005/0069002 A1 | 3/2005 | Senga et al. |

(Continued)

FOREIGN PATENT DOCUMENTS

| JP | S55-68686 A | 5/1980 |
| JP | H03036777 A | 2/1991 |

(Continued)

OTHER PUBLICATIONS

International Search Report issued in International Patent Application No. PCT/JP2019/042341 dated Jan. 7, 2020 and English translation of same. 5 pages.

(Continued)

*Primary Examiner* — Tuan N Nguyen
(74) *Attorney, Agent, or Firm* — K&L Gates LLP

(57) ABSTRACT

A surface emission laser driving method according to an embodiment of the present technology includes the following two steps. (A) Generating drive pulses to be sequentially outputted to, out of a plurality of surface emission lasers disposed on a same substrate, each of the surface emission lasers selected as light-emission targets, on the basis of the number of surface emission lasers selected as the light-emission targets and a monitoring temperature that is immediately prior to light emission of each of the surface emission lasers selected as the light-emission targets. (B) Outputting the generated drive pulses to each of the surface emission lasers selected as the light-emission targets.

4 Claims, 18 Drawing Sheets

(56) References Cited

U.S. PATENT DOCUMENTS

| | | | |
|---|---|---|---|
| 2007/0285491 A1* | 12/2007 | Kishimoto | G06K 15/1209 |
| | | | 347/233 |
| 2009/0232174 A1 | 9/2009 | Furukawa et al. | |
| 2010/0033508 A1* | 2/2010 | Mizushima | H04N 9/3161 |
| | | | 372/38.02 |
| 2011/0243174 A1 | 10/2011 | Maeda et al. | |
| 2012/0250713 A1* | 10/2012 | Maeda | H01S 5/06808 |
| | | | 372/38.02 |
| 2019/0296518 A1 | 9/2019 | Maeda et al. | |

FOREIGN PATENT DOCUMENTS

| | | |
|---|---|---|
| JP | 2006-048885 A | 2/2006 |
| JP | 2007-329429 A | 12/2007 |
| JP | 2009-069663 A | 4/2009 |
| JP | 2011071330 A | 4/2011 |
| JP | 2011216662 A | 10/2011 |
| JP | 2011-222548 A | 11/2011 |
| JP | 2012-209501 A | 10/2012 |
| JP | 2013-226746 A | 11/2013 |
| JP | 2014-075492 A | 4/2014 |
| JP | 2014075479 A | 4/2014 |
| WO | WO2006/106810 A1 | 10/2006 |
| WO | WO2008/041648 A1 | 4/2008 |
| WO | WO2018/096949 A1 | 5/2018 |

OTHER PUBLICATIONS

Written Opinion issued in International Patent Application No. PCT/JP2019/042341 dated Jan. 7, 2020. 3 pages.

* cited by examiner

[ FIG. 1 ]
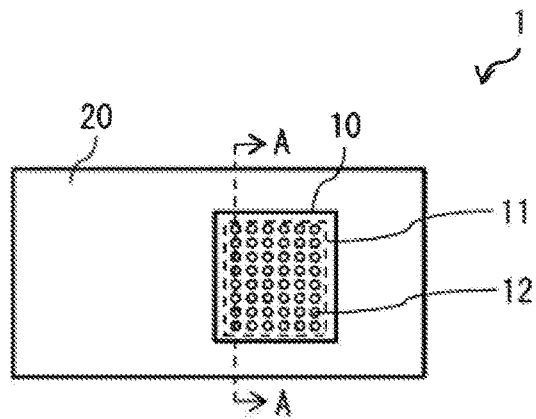
[ FIG. 2 ]
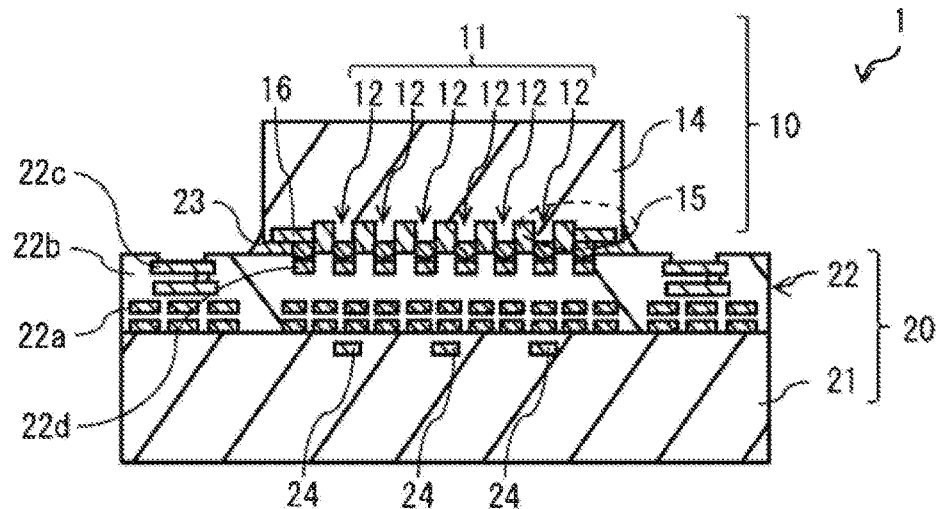
[ FIG. 3 ]
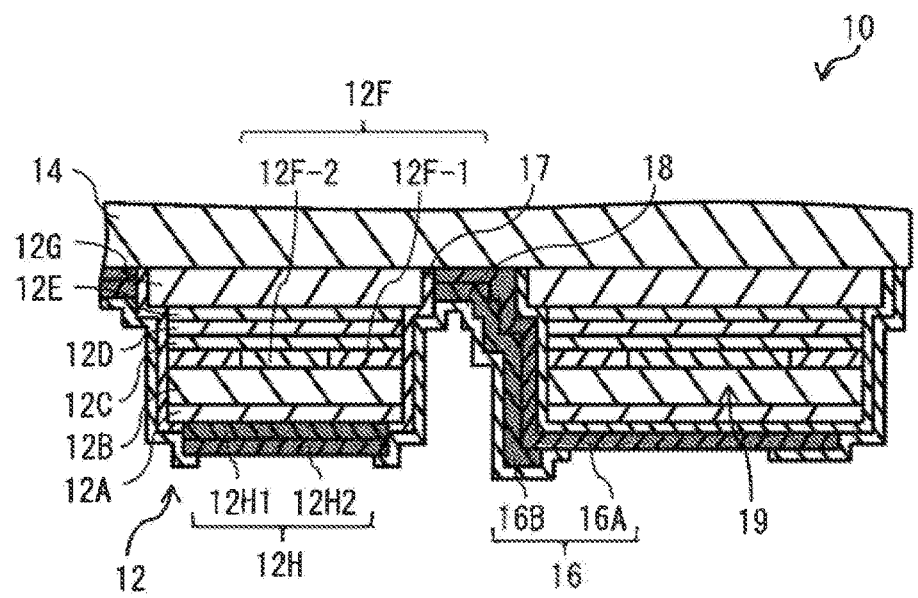

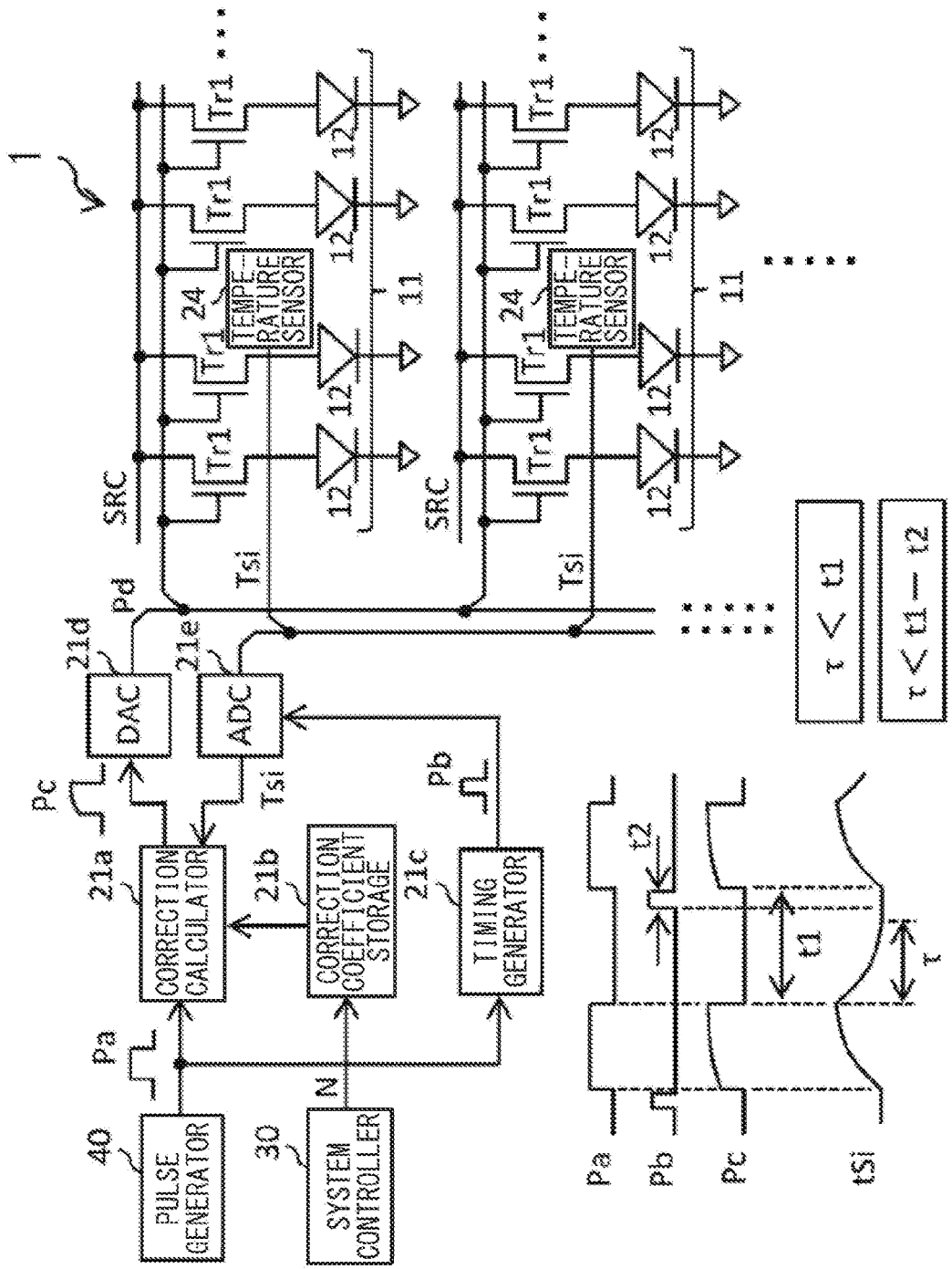
[ FIG. 4 ]

[ FIG. 5 ]
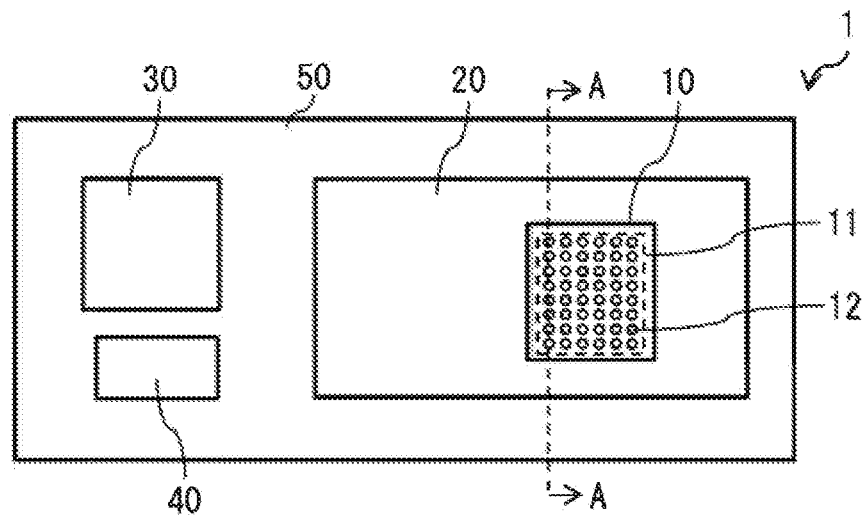
[ FIG. 6 ]
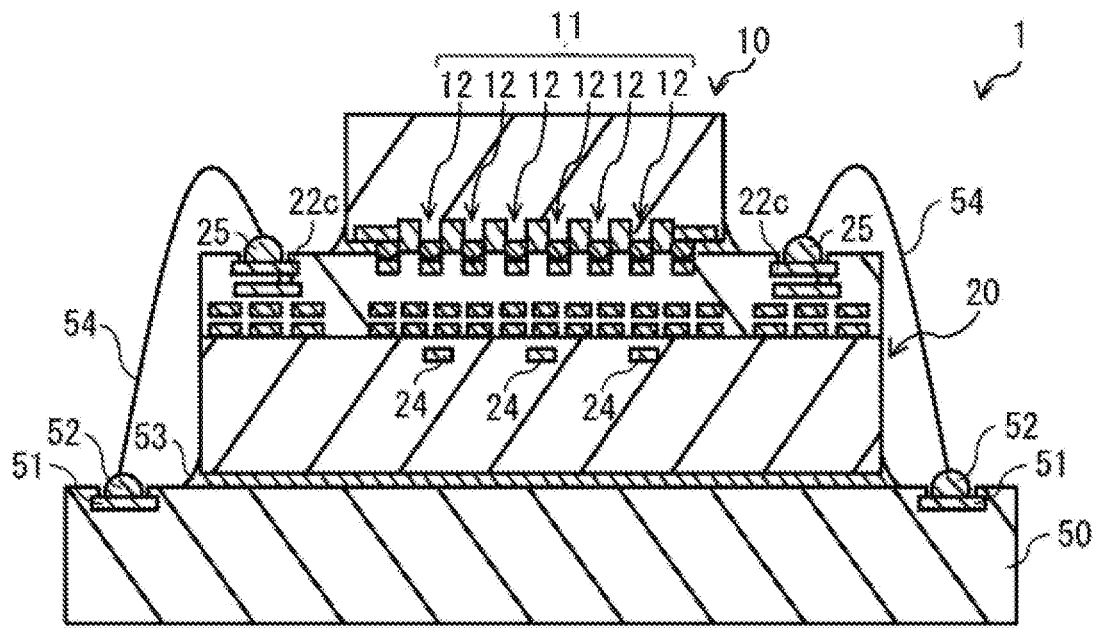

[ FIG. 7 ]
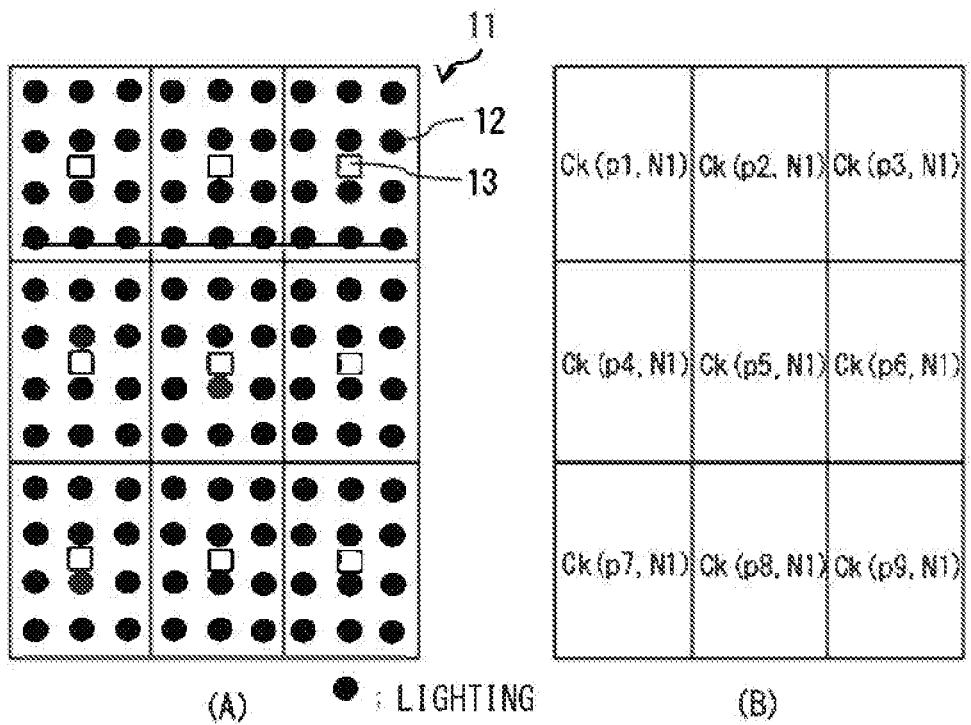
(A)　●: LIGHTING　(B)
[ FIG. 8 ]
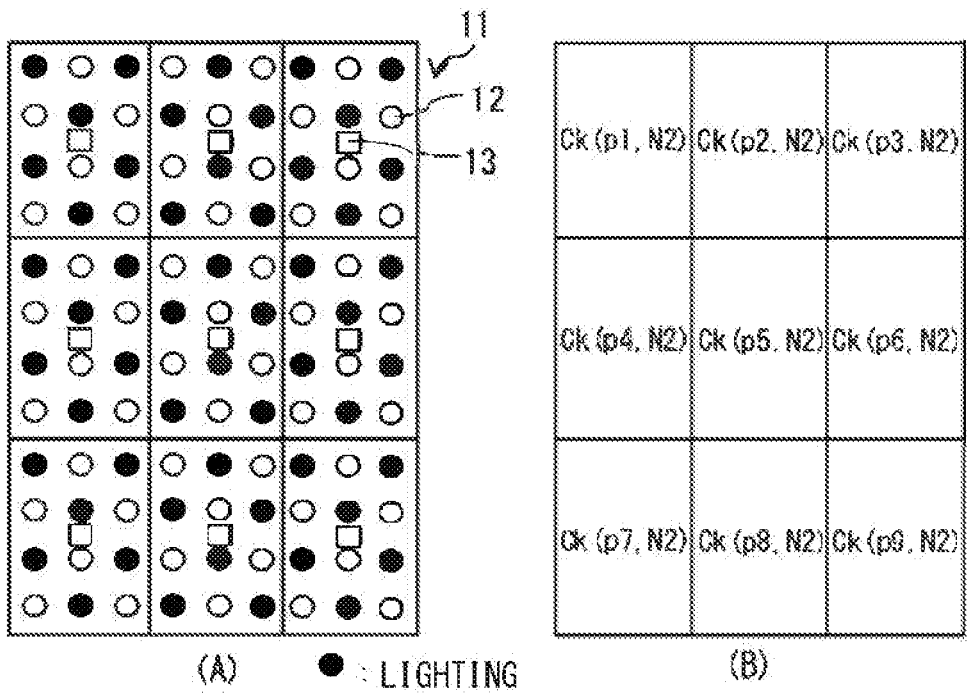
(A)　●: LIGHTING　(B)

[ FIG. 9 ]
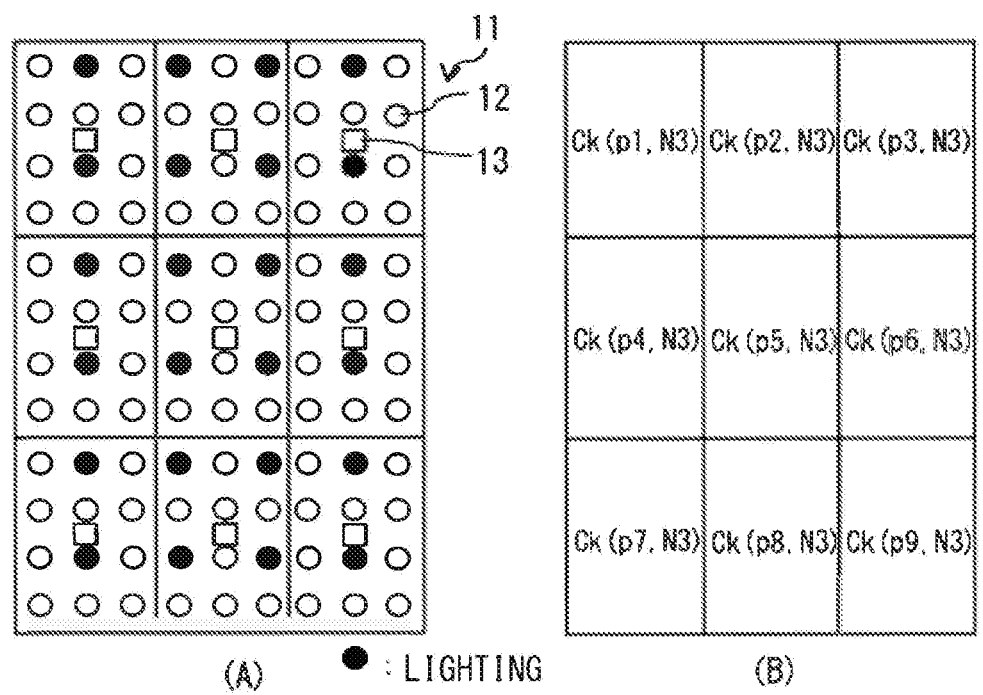

[ FIG. 10 ]
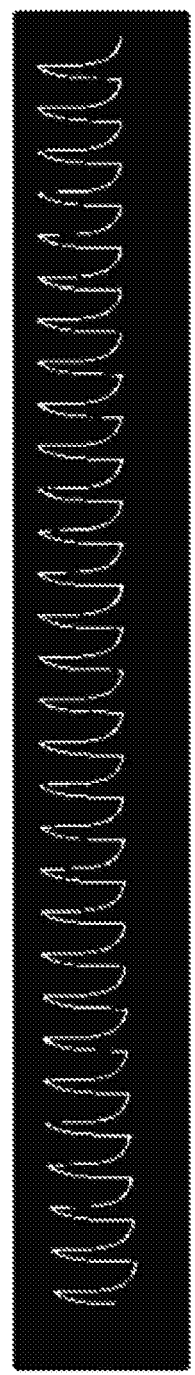

[ FIG. 11 ]

| | WEIGHT | TIME CONSTANT | CAUSE OF THERMAL TIME CONSTANT |
|---|---|---|---|
| RCth1 | 22% | 12 μs | SELF-GENERATED HEAT INSIDE SURFACE EMISSION LASER |
| RCth2 | 19% | 500 μs | HEAT FROM ADJACENT ELEMENT |
| RCth3 | 24% | 3ms | |
| RCth4 | 35% | 80ms | HEAT GENERATION OF SURFACE EMISSION LASER DEVICE AS A WHOLE |

[ FIG. 12 ]
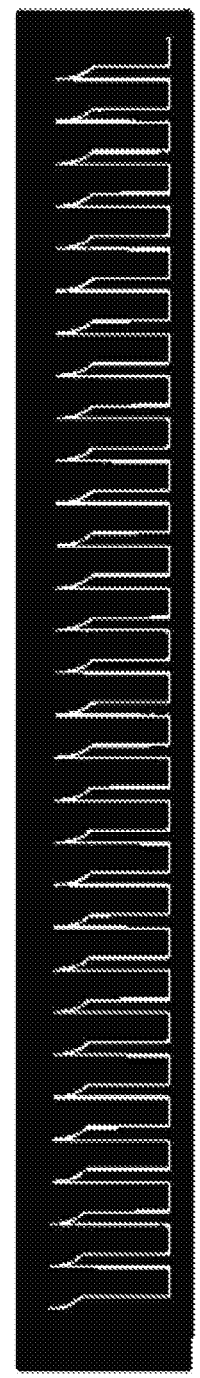

[ FIG. 13 ]
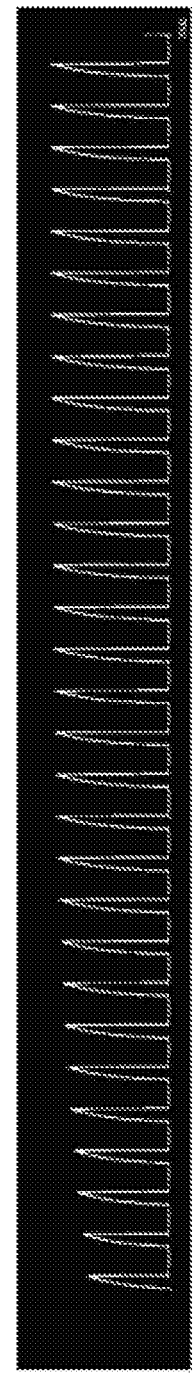

[ FIG. 14 ]
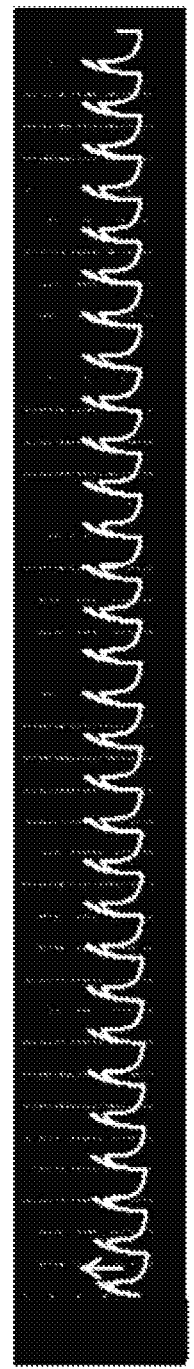

[ FIG. 15 ]
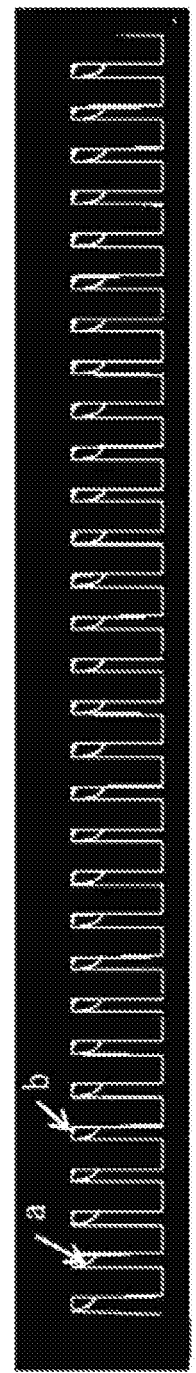

[ FIG. 16 ]
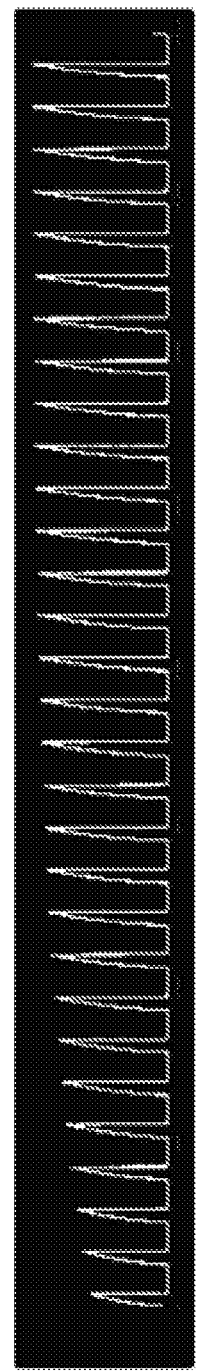

[ FIG. 17 ]
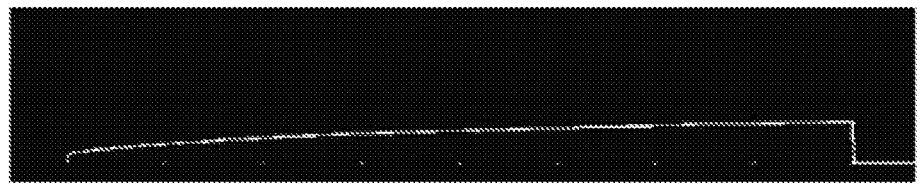
[ FIG. 18 ]
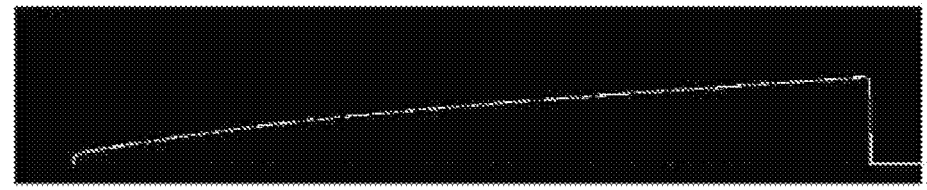
[ FIG. 19 ]
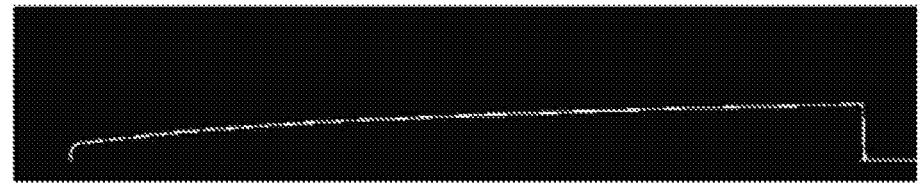
[ FIG. 20 ]
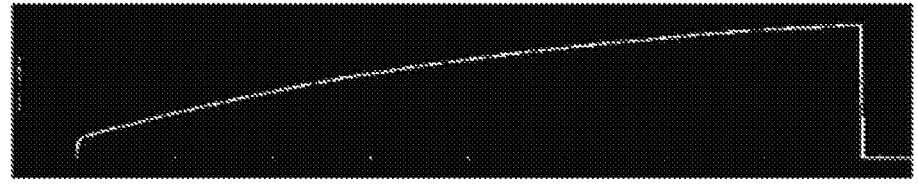

[ FIG. 21 ]
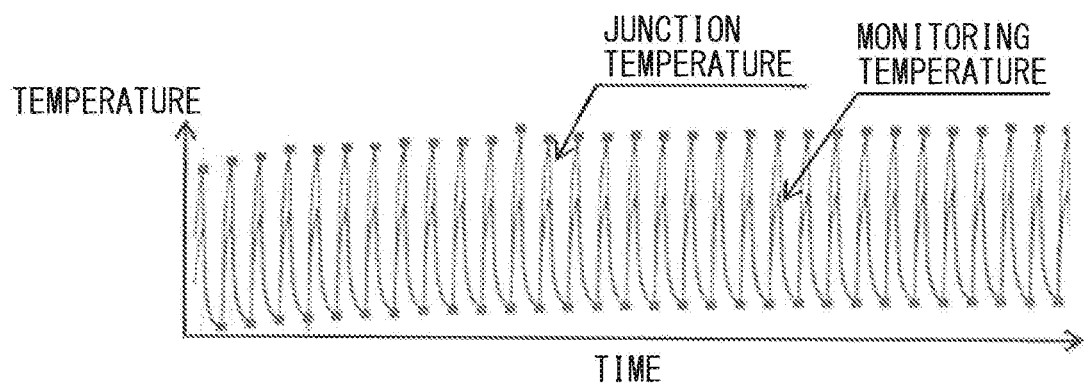
[ FIG. 22 ]
|  | TA1 [μs] | TA2 [ms] | TA3 [ms] | C1 [mA] | C2 [mA] | C3 [mA] |
|---|---|---|---|---|---|---|
| N=400 | 12 | 1 | 8 | 0.90 | 1.75 | 13.00 |
| N=300 | 12 | 1 | 8 | 0.90 | 1.70 | 6.60 |
| N=200 | 12 | 1 | 8 | 0.90 | 1.70 | 2.90 |
[ FIG. 23 ]
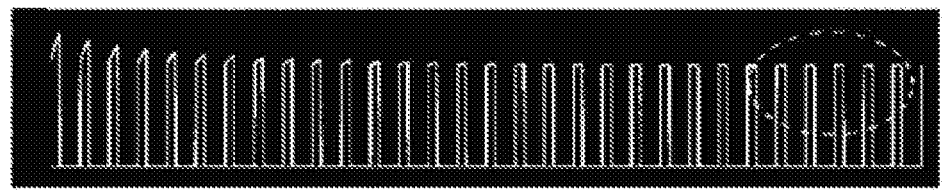
[ FIG. 24 ]
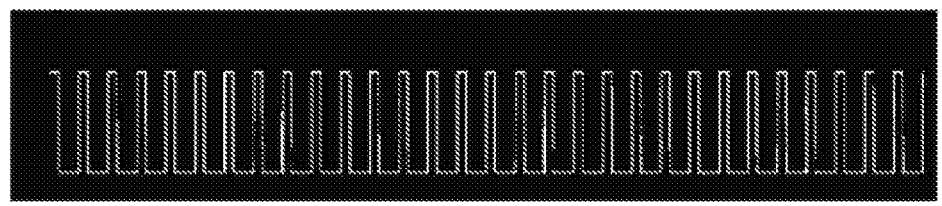

[ FIG. 25 ]
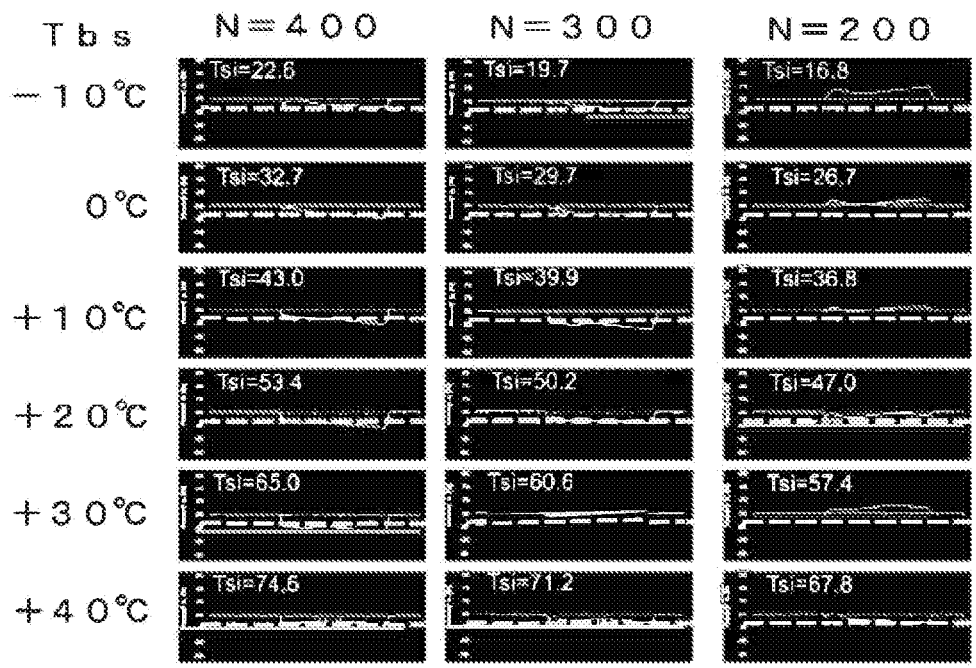
[ FIG. 26 ]
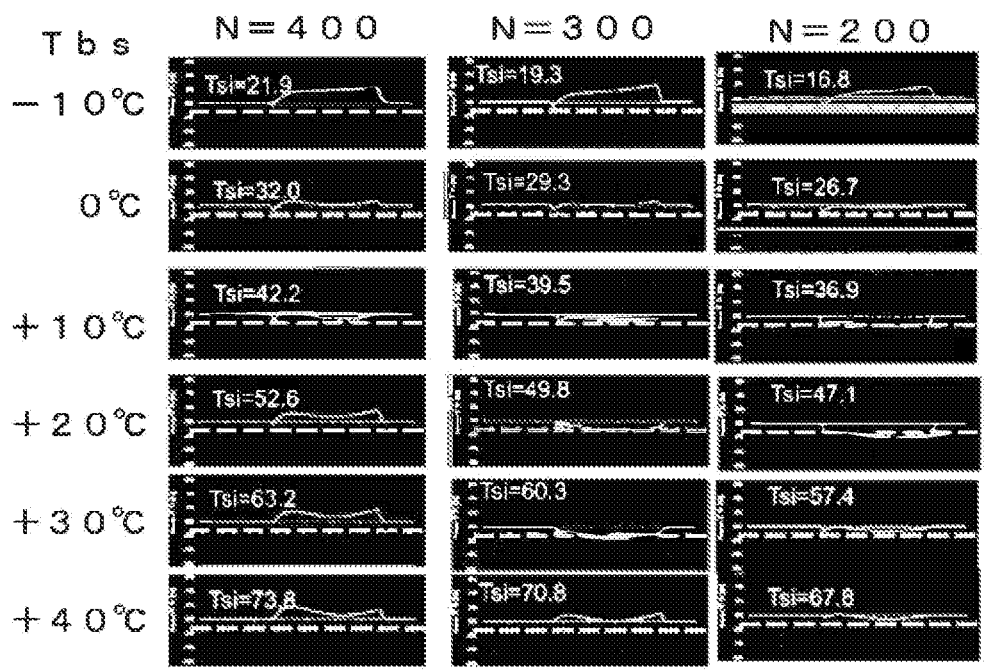

[ FIG. 27 ]
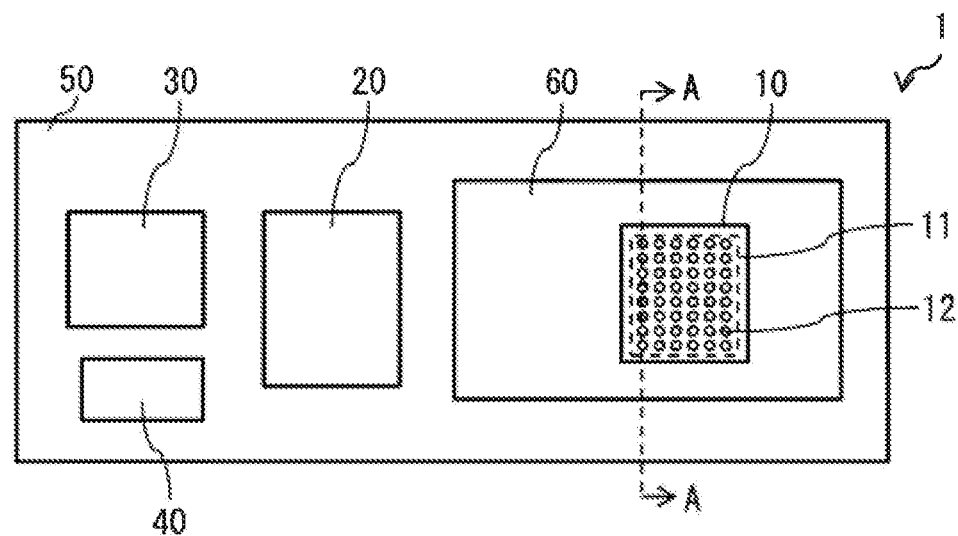
[ FIG. 28 ]
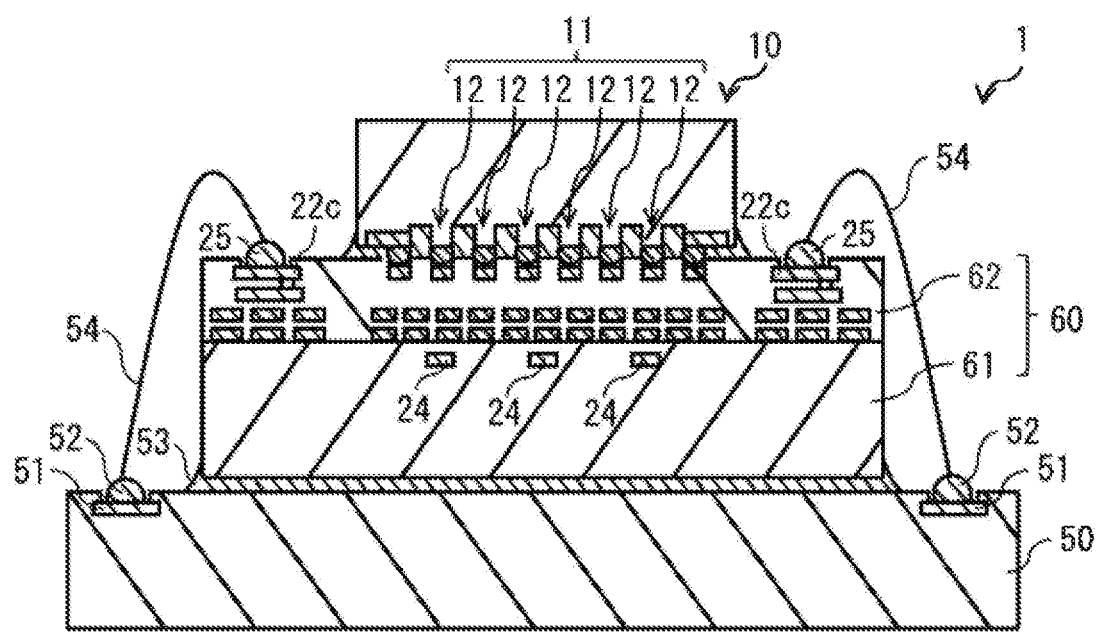

[ FIG. 29 ]
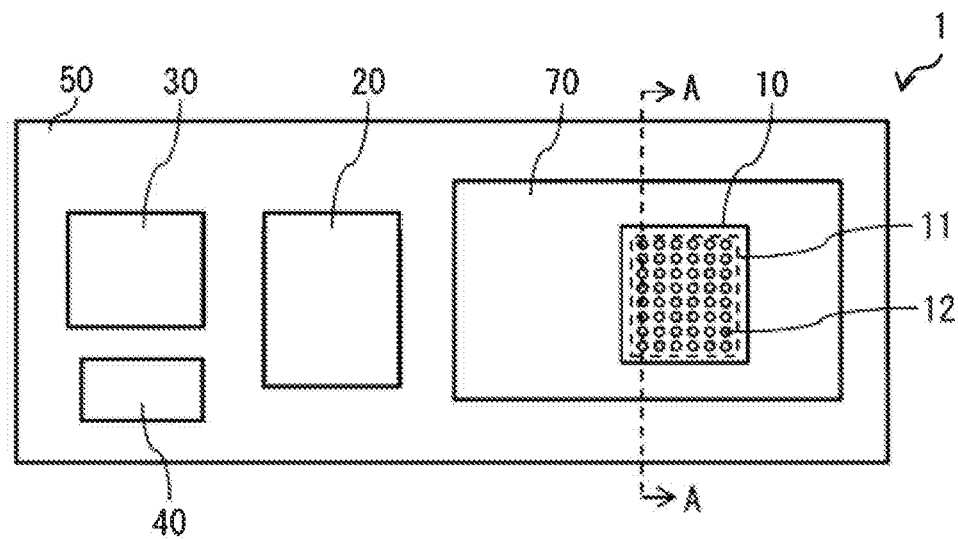
[ FIG. 30 ]
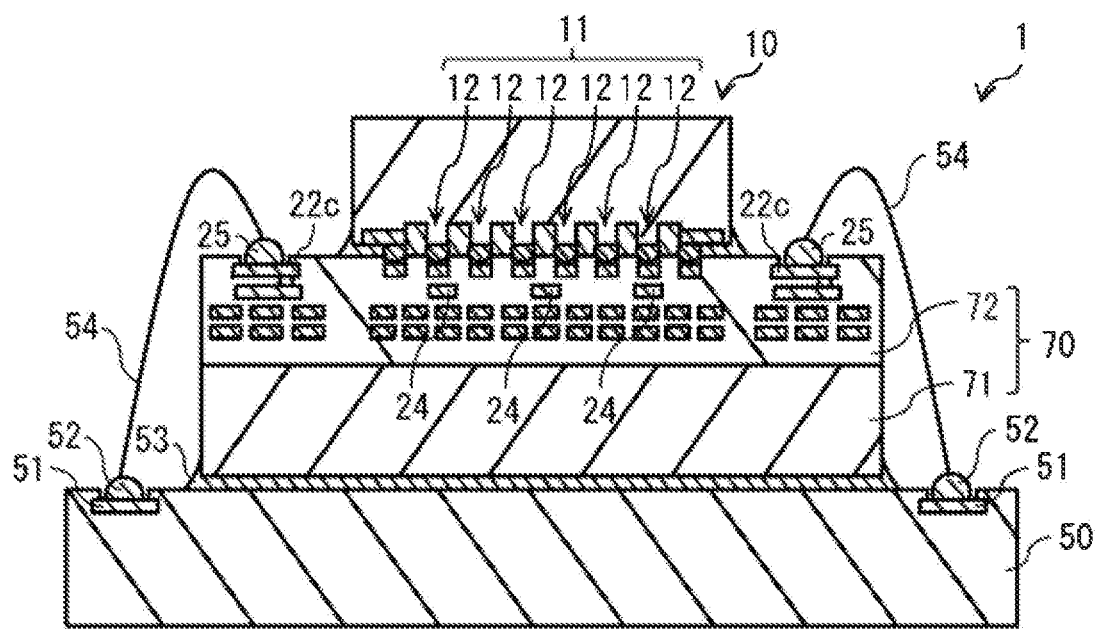

[FIG. 31]
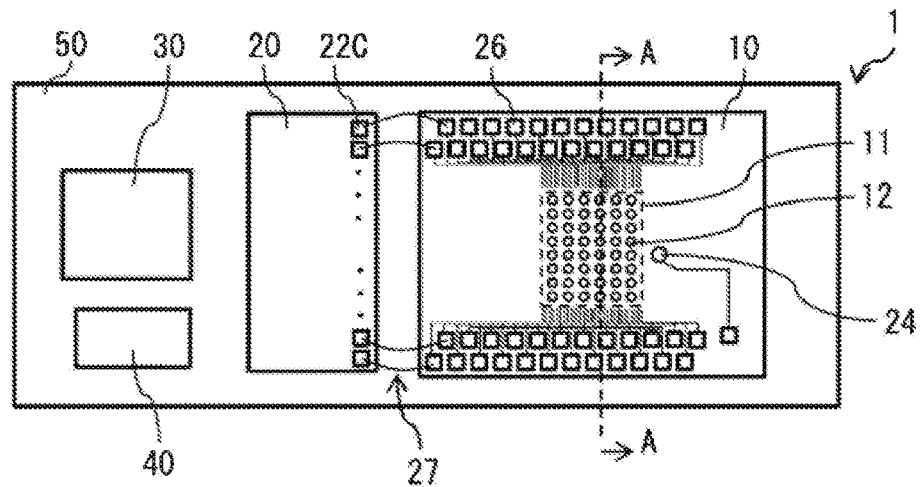
[FIG. 32]
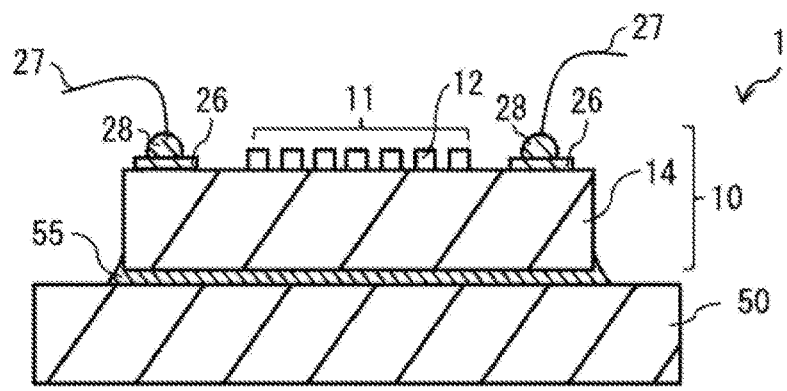
[FIG. 33]
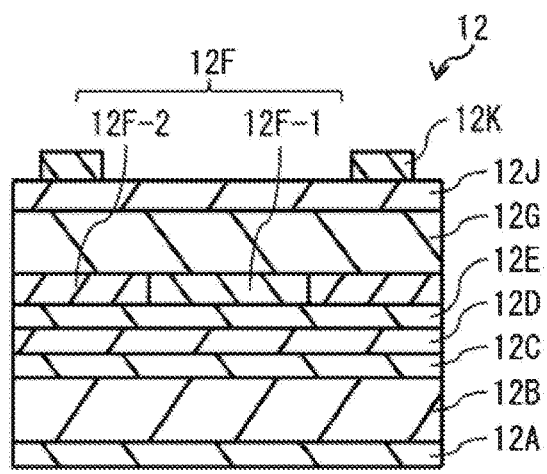

SURFACE EMISSION LASER DRIVING METHOD AND SURFACE EMISSION LASER DEVICE

TECHNICAL FIELD

The present technology relates to a method of driving a surface emission type semiconductor laser (hereinafter referred to as a "surface emission laser") that outputs laser light from a top surface, and a surface emission laser device including the surface emission laser.

BACKGROUND ART

In recent years, in the field of a surface emission laser, a laser array in which a plurality of surface emission lasers is formed on the same substrate has been actively developed. The laser array is used as a light source of, for example, a laser printer or a structured light system.

CITATION LIST

Patent Literature

Patent Literature 1: Japanese Unexamined Patent Application Publication No. 2013-226746
Patent Literature 2: Japanese Unexamined Patent Application Publication No. 2014-075492

SUMMARY OF THE INVENTION

Incidentally, in the field of the above-described laser array, there is an issue in that a light emission intensity is lowered due to a thermal crosstalk when a plurality of surface emission lasers emits light at the same time. Accordingly, it is desirable to provide a surface emission laser driving method and a surface emission laser device that make it possible to suppress a decrease in a light emission intensity due to a thermal crosstalk.

A surface emission laser driving method according to one embodiment of the present technology includes the following two steps.
(A) Generating drive pulses to be sequentially outputted to, out of a plurality of surface emission lasers disposed on a same substrate, each of the surface emission lasers selected as light-emission targets, on the basis of the number of surface emission lasers selected as the light-emission targets and a monitoring temperature that is immediately prior to light emission of each of the surface emission lasers selected as the light-emission targets.
(B) Outputting the generated drive pulses to each of the surface emission lasers selected as the light-emission targets.

A surface emission laser device according to one embodiment of the present technology includes: a plurality of surface emission lasers disposed on a same substrate; and a drive circuit that drives the plurality of surface emission lasers. The drive circuit generates a plurality of drive pulses to be sequentially outputted to, out of the plurality of surface emission lasers, each of the surface emission lasers selected as light-emission targets, on the basis of the number of surface emission lasers selected as the light-emission targets and a monitoring temperature that is immediately prior to light emission of each of the surface emission lasers selected as the light-emission targets, and thereafter outputs the plurality of generated drive pulses to each of the surface emission lasers selected as the light-emission targets.

In the surface emission laser driving method and the surface emission laser device according to one embodiment of the present technology, the plurality of drive pulses to be sequentially outputted to each of the surface emission lasers selected as the light-emission targets is generated on the basis of the number of surface emission lasers as the light-emission targets and the monitoring temperature. As a result, the drive pulses considering a thermal crosstalk when the plurality of surface emission lasers emits light simultaneously are generated.

BRIEF DESCRIPTION OF THE DRAWINGS

FIG. 1 is a diagram illustrating a planar configuration example of a surface emission laser device according to an embodiment of present technology.
FIG. 2 is a diagram illustrating a cross-sectional configuration example taken along the line A-A in FIG. 1.
FIG. 3 is a diagram illustrating a cross-sectional configuration example of emitters of FIG. 1.
FIG. 4 is a diagram illustrating a circuit configuration example of the surface emission laser device of FIG. 1.
FIG. 5 is a diagram illustrating a planar configuration example when a laser driver IC of FIG. 1 is mounted on a printed wiring substrate.
FIG. 6 is a diagram illustrating a cross-sectional configuration example taken along the line A-A in FIG. 5.
(A) in FIG. 7 is a diagram illustrating how all the emitters emit light. (B) is a diagram illustrating correction coefficients when all the emitters emit light.
(A) in FIG. 8 is a diagram illustrating how a part of the emitters emit light. (B) is a diagram illustrating correction coefficients when a part of the emitters emits light.
(A) in FIG. 9 is a diagram illustrating how a part of the emitters emit light. (B) is a diagram illustrating correction coefficients when a part of the emitters emits light.
FIG. 10 is a diagram illustrating a simulation result of a junction temperature in a correction current model using a thermal time constant.
FIG. 11 is a diagram illustrating an example of a time constant in the correction current model of FIG. 10.
FIG. 12 is a diagram illustrating a simulation result of a light output waveform in the correction current model of FIG. 10.
FIG. 13 is a diagram illustrating a simulation result of a correction current in the correction current model of FIG. 10.
FIG. 14 is a diagram illustrating a simulation result of a correction current in the correction current model of FIG. 10.
FIG. 15 is a diagram illustrating a simulation result of a light output waveform after the application of the correction current in the correction current model of FIG. 10.
FIG. 16 is a diagram illustrating a simulation result of a corrected and converged light output waveform in the correction current model of FIG. 10.
FIG. 17 is a diagram illustrating a simulation result of a correction current waveform of a first wave in the correction current model of FIG. 10.
FIG. 18 is a diagram illustrating a simulation result of a correction current waveform of a thirtieth wave in the correction current model of FIG. 10.
FIG. 19 is a diagram illustrating a simulation result of the correction current waveform of the first wave in the correction current model of FIG. 10.

FIG. 20 is a diagram illustrating a simulation result of the correction current waveform of the thirtieth wave in the correction current model of FIG. 10.

FIG. 21 is a diagram illustrating an example of a junction temperature and a monitoring temperature at the time of operation.

FIG. 22 is a diagram illustrating an example of coefficients that vary with the number of emitters.

FIG. 23 is a diagram illustrating an example of a light output waveform when a correction current expression is used.

FIG. 24 is a diagram illustrating an example of a light output waveform when a correction current expression is used.

FIG. 25 is a diagram illustrating an example of a correction accuracy of a correction current pulse when a correction current expression is used.

FIG. 26 is a diagram illustrating an example of a correction accuracy of a correction current pulse when a correction current expression is used.

FIG. 27 is a diagram illustrating a planar configuration example when a laser chip is disposed on a temperature sensor unit.

FIG. 28 is a diagram illustrating a cross-sectional configuration example taken along the line A-A in FIG. 27.

FIG. 29 is a diagram illustrating a planar configuration example when the laser chip is disposed on the temperature sensor unit.

FIG. 30 is a diagram illustrating a cross-sectional configuration example taken along the line A-A in FIG. 29.

FIG. 31 is a diagram illustrating a modification example of a planar configuration of the surface emission laser device according to the above embodiment.

FIG. 32 is a diagram illustrating a cross-sectional configuration example taken along the line A-A of the surface emission laser device of FIG. 31.

FIG. 33 is a diagram illustrating a cross-sectional configuration example of the respective emitters of FIGS. 31 and 32.

MODES FOR CARRYING OUT THE INVENTION

The following describes an embodiment of the present technology in detail with reference to the drawings.

A face authentication system of a structured light (Structured Light) type to be mounted on a smartphone, etc., mainly employs a multi-emitter type surface emission laser (VCSEL) as a light source of a dot projector which is to be applied toward the human face. An operation of the surface emission laser has the following features because of the nature of the application of the structured light.

Number of simultaneous emissions of light: N=several tens to several hundreds of emitters Light output: Po=several mW/emitter Pulse width: Tpw=several milliseconds Number of pulses: several tens of times (e.g., about 30 times)

As a security measure (a measure for preventing an erroneous detection) for the face authentication system, it is said that it is effective to increase the number of projected patterns of dots as much as possible and to make combinations of authentications different from user to user. To achieve this, emitters (a surface emission laser) and a laser driver that operates the emitters are desired to have a function of independently driving the respective emitters. By increasing the number of emitters that emit light at the same time, it is possible to increase the number of combinations of dot projections. At the same time, however, an issue of a thermal crosstalk occurs, so that an unevenness occurs in a light output of the respective emitters in a plane. The term "an unevenness of a light output" as used herein includes not only an in-plane distribution in which a middle portion of an emitter array is dark and a peripheral portion is bright, but also a droop phenomenon that occurs in a pulse width of ms. The droop phenomenon refers to a phenomenon in which a crest value of an initial light pulse is large, but the crest value of the light pulse decreases with an elapse of time.

Such a destabilization of a light output due to heat causes an authentication error, so that it is desirable that the light output from the individual emitters be constant, whether an operating environment is changed, whether the number of light emission emitters is changed, or a pattern of dots to be applied is changed. Therefore, the present disclosure proposes a method of stable operation of a surface emission laser, which is aimed at enhancing a functionality of the face authentication system based on a smartphone or the like.

1. Embodiment

[Configuration]

A surface emission laser device 1 according to an embodiment of the present technology will be described. FIG. 1 illustrates a planar configuration example of the surface emission laser device 1 according to the present embodiment. FIG. 2 illustrates a cross-sectional configuration example taken along the line A-A of FIG. 1. The surface emission laser device 1 includes a laser chip 10 and a laser driver IC 20. In the present embodiment, the laser chip 10 is disposed on the laser driver IC 20. The laser chip 10 is electrically coupled to the laser driver IC 20 via, for example, a bump 15 to be described later. A joining layer 23 is provided between the laser chip 10 and the laser driver IC 20. The joining layer 23 fixes the laser chip 10 and the laser driver IC 20 with respect to each other. The joining layer 23 includes, for example, an insulating resin material. The joining layer 23 is formed to fill a gap between the laser chip 10 and the laser driver IC 20.

The laser chip 10 has, for example, a substrate 14, an emitter array 11 formed on a surface on the laser driver IC 20 side of the substrate 14, and a plurality of bumps 15 formed on a surface on the laser driver IC 20 side of the substrate 14. For example, as illustrated in FIGS. 1 and 2, the emitter array 11 includes a plurality of emitters 12 disposed on the same substrate 14. The plurality of emitters 12 is, for example, arranged on the substrate 14 at equal intervals in a row direction, and is also arranged at equal intervals in a column direction. The plurality of emitters 12 may be randomly disposed on the same substrate 14. Each emitter 12 is configured by a surface emission type semiconductor laser that outputs laser light in a stacking direction. In the present embodiment, each emitter 12 outputs, through the substrate 14, the laser light on the opposite side of the laser driver IC 20. The substrate 14 includes, for example, an n-type semiconductor substrate.

As illustrated in FIG. 3, for example, each emitter 12 has a columnar vertical resonator structure in which a contact layer 12A, a DBR layer 12B, a spacer layer 12C, an active layer 12D, a spacer layer 12E, a current confining layer 12F, and a DBR layer 12G are stacked in this order from the laser driver IC 20 side. FIG. 3 illustrates a cross-sectional configuration example of a portion surrounded by a broken line in the laser chip 10 illustrated in FIG. 2. In the present embodiment, each emitter 12 is, for example, obtained by forming the n-type semiconductor substrate of the substrate 14 as a crystal-growth substrate.

The contact layer 12A includes, for example, p-type $Al_{x1}Ga_{1-x1}As$ ($0 \leq x1 < 1$). The DBR layer 12B is configured by alternately stacking a low refractive index layer (not illustrated) and a high refractive index layer (not illustrated). The low refractive index layer includes, for example, p-type $Al_{x2}Ga_{1-x2}As$ ($0 < x2 < 1$) having an optical thickness of $\lambda 1/4$ ($\lambda 1$ is an oscillating wavelength), and the high refractive index layer includes, for example, p-type $Al_{x3}Ga_{1-x3}As$ ($0 \leq x3 < x2$) having an optical thickness of $\lambda 1/4$. The spacer layer 12C includes, for example, p-type $Al_{x4}Ga_{1-x4}As$ ($0 \leq x4 < 1$). The contact layer 12A, the DBR layer 12B, and the spacer layer 12C contain, for example, a p-type impurity such as carbon (C).

The active layer 12D has, for example, a multi-quantum-well structure formed by alternately stacking a well layer (not illustrated) that includes undoped $In_{x5}Ga_{1-x5}As$ ($0 < x5 < 1$) and a barrier layer (not illustrated) that includes undoped $In_{x6}Ga_{1-x6}As$ ($0 < x6 < x5$). It should be noted that a region of the active layer 12D facing a current injection region 12F-2 (to be described later) is a light emission region.

The spacer layer 12E includes, for example, n-type $Al_{x7}Ga_{1-x7}As$ ($0 \leq x7 < 1$). The DBR layer 12G is configured by alternately stacking a low refractive index layer (not illustrated) and a high refractive index layer (not illustrated). The low refractive index layer includes, for example, n-type $Al_{x8}Ga_{1-x8}As$ ($0 < x8 < 1$) having an optical thickness of $\lambda 1/4$, and the high refractive index layer includes, for example, n-type $Al_{x9}Ga_{1-x9}As$ ($0 \leq x9 < x8$) having an optical thickness of $\lambda 1/4$. The DBR layer 12G is in contact with the substrate 14, and is electrically coupled to, for example, the n-type semiconductor substrate of the substrate 14. The spacer layer 12E and the DBR layer 12G contain an n-type impurity such as silicon (Si).

The current confining layer 12F has a current confining region 12F-1 in a peripheral region of the current injection region 12F-2. The current injection region 12F-2 includes, for example, p-type $Al_{x10}Ga_{1-x10}As$ ($0 < x10 \leq 1$). On the other hand, the current confining region 12F-1 includes, for example, $Al_2O_3$ (an aluminum oxide). The current confining region 12F-1 is obtained, for example, by oxidizing highly concentrated Al contained in the current confining layer 12F from a side face. Accordingly, the current confining layer 12F has a function of confining a current.

Each emitter 12 further has an electrode layer 12H in contact with the contact layer 12A, for example, as illustrated in FIG. 3. The electrode layer 12H is electrically coupled to the contact layer 12A. The electrode layer 12H is also in contact with the bump 15 and is electrically coupled to the laser driver IC 20 via the bump 15. The electrode layer 12H is coupled to a switch device Tr1 (described later) in the laser driver IC 20. The electrode layer 12H has a contact layer 12H1 and a pad layer 12H2 in this order from the contact layer 12A side. The contact layer 12H1 is formed, for example, by stacking a Ti layer, a Pt layer, and an Au layer in this order. The pad layer 12H2 is formed by stacking a Ti layer, a Pt layer, and an Au layer in this order.

Each emitter 12 further has insulation layers 17 and 18 that protect the emitter 12, for example, as illustrated in FIG. 3. The insulation layer 17 covers a side face of the emitter 12 and has an opening at a portion of the emitter 12 facing the electrode layer 12H. The insulation layer 17 also covers a portion that structures a base of a connection pad 16 described later. The insulation layer 17 includes SiN, for example. The insulation layer 18 is in contact with a surface of the insulation layer 17 and has an opening at a portion of the emitter 12 facing the electrode layer 12H. The insulation layer 18 covers a portion of the later-described connection pad 16 which is formed on a side face of the base. The insulation layer 18 includes SiN, for example.

The laser chip 10 has the connection pad 16 around the emitter array 11, for example, as illustrated in FIGS. 2 and 3. The connection pad 16 is formed on a surface on the laser driver IC 20 side of a base 19, which has a structure common with the vertical resonator structure in the emitter 12. The connection pad 16 extends from a side face of the base 19 to a surface of the substrate 14. The connection pad 16 is electrically coupled to, for example, the n-type semiconductor substrate of the substrate 14. That is, the connection pad 16 is electrically coupled to the DBR layer 12G of each emitter via the substrate 14. The connection pad 16 is also in contact with the bump 15 and is electrically coupled to the laser driver IC 20 via the bump 15. For example, the connection pad 16 has the same potential as a reference potential of the laser driver IC 20. The connection pad 16 has a pad layer 16A and a wiring line layer 16B in this order from the base 19. The pad layer 16A is formed, for example, by stacking a Ti layer, a Pt layer, and an Au layer in this order. The wiring line layer 16B is configured by an Au layer. The wiring line layer 16B may have a metal layer at a position in contact with substrate 14. The metal layer is formed by stacking, for example, a AuGe layer, a Ni layer, and an Au layer in this order.

The laser driver IC 20 independently drives the plurality of emitters 12 provided in the laser chip 10 to cause a part or all of the plurality of emitters 12 to emit light. The laser driver IC 20 drives, for example, a part or all of the emitters 12 selected by a later-described system controller 30 among the plurality of emitters 12. The laser driver IC 20 has, for example, a Si-substrate 21, a wiring line layer 22 formed on the Si-substrate 21, and a plurality of temperature sensors 24 formed on the Si-substrate 21.

The Si-substrate 21 has a drive circuit that generates a drive pulse Pd for performing light emission and light quenching of the plurality of emitters 12 provided on the laser chip 10, and the plurality of temperature sensors 24. The drive circuit is electrically coupled to the laser chip 10 (the respective emitters 12) via the wiring line layer 22. The drive circuit is also electrically coupled to the plurality of temperature sensors 24.

The wiring line layer 22 includes, in an insulation layer 22b, a plurality of metal layers 22a, a plurality of connection pads 22c, and a plurality of connection pads 22d, for example. The plurality of metal layers 22a electrically couples the drive circuit in the Si-substrate 21 and the plurality of connection pads 22d to each other. The plurality of metal layers 22a is further electrically coupled to the plurality of temperature sensors 24 in the Si-substrate 21. The plurality of connection pads 22d is disposed at a position, of the wiring line layer 22, that is opposed to the laser chip 10, and is electrically coupled to the plurality of bumps 15 provided in the laser chip 10. The plurality of connection pads 22c is disposed at a position, of the wiring line layer 22, that is not opposed to the laser chip 10, and is electrically coupled to, for example, a bonding wire 54 described later. Note that a manner in which the laser chip 10 and the laser driver IC 20 are electrically coupled is not limited to that illustrated in FIG. 2.

Each temperature sensor 24 includes, for example, a photodiode or a polysilicon resistor. Each temperature sensor 24 is disposed at a position, of the Si-substrate 21, that is opposed to the laser chip 10. Each temperature sensor 24 is further disposed at a position at which a thermal time constant τ between an active layer 12D (to be described later) of each emitter 12 and each temperature sensor 24 becomes shorter than a pulse interval t1 (to be described later). The thermal time constant τ refers to, for example, the time necessary for a temperature difference between the active layer 12D of each emitter 12 and each temperature sensor 24 to become 1/e. Each temperature sensor 24 is further disposed at a position at which the thermal time constant τ becomes shorter than t1-t2. Note that t2 is a period t2 at which a monitoring temperature Tsi is read from the temperature sensor 24 immediately prior to the light emission. This allows each temperature sensor 24 to measure a temperature that is equal to or substantially equal to a junction temperature Tj(t) (an active layer temperature) that is immediately prior to the light emission of each emitter 12.

FIG. 4 illustrates a circuit configuration example of the surface emission laser device 1. In the surface emission laser device 1, the laser chip 10 has, for example, the plurality of emitters 12 and a plurality of switch devices Tr1 provided by one by one for each emitter 12. Each switch device Tr1 is coupled in series to the corresponding emitter 12. In each switch device Tr1, a DAC 21d (described later) is coupled to a gate, the emitter 12 is coupled to a source, and a voltage line SRC to which a binary voltage (VDD and VSS) is applied is coupled to a drain. VDD is a voltage value of a magnitude necessary to provide a drive current to the emitter 12. VSS is a voltage value of a magnitude necessary to keep the switch device Tr1 turned off. Each switch device Tr1 is turned on and off by a drive current Pd inputted from the DAC 21d (described below) to the gate and a voltage inputted from the power supply line SRC to the drain, thereby controlling a current flowing to the corresponding emitter 12.

In the surface emission laser device 1, the laser driver IC 20 has, as the drive circuit described above, a correction calculator 21a, a correction coefficient storage 21b, a timing generator 21c, the DAC 21d, and an ADC 21e, for example.

The correction calculator 21a generates a plurality of drive pulses Pc to be sequentially outputted to each of the emitters 12 selected as light-emission targets, on the basis of the number N of emitters 12 selected as the light-emission targets and the monitoring temperature Tsi that is immediately prior to the light emission of each of the emitters 12 selected as the light-emission targets, at a pulse interval t1 that is equal to or greater than a time necessary for the monitoring temperature Tsi and the junction temperature Tj(t) (the active layer temperature) to coincide after the light emission. Specifically, the correction calculator 21a generates a correction current pulse on the basis of an expression described later, and superimposes the generated correction current pulse on a rectangular basic current pulse Pa generated by a pulse generator 40, thereby generating the drive pulse Pc. The correction calculator 21a generates the correction current pulse using various values of correction coefficients inputted from the correction coefficient storage 21b. The correction calculator 21a generates the correction current pulse by using the monitoring temperature Tsi inputted from each of the temperature sensors 24. That is, the monitoring temperature Tsi is measured by each of the temperature sensors 24. The correction calculator 21a outputs, via the DAC 21d, the plurality of generated drive pulses Pc to each of the emitters 12 selected as the light-emission targets, at the pulse interval t1. The correction calculator 21a converts the plurality of generated drive pulses Pc into analog drive pulses Pd and outputs the converted drive pulses to each of the emitters 12 selected as the light-emission targets, at the pulse interval t1. The pulse interval t1 is a value in a range of 1 ms or greater and 999 ms or less (that is, a value on the order of ms) and is, for example, several tens of micrometers.

The correction coefficient storage 21b stores various correction coefficients to be used for later-described expressions. When the number N of emitters 12 to emit light is inputted from the system controller 30, the correction coefficient storage 21b outputs, to the correction calculator 21a, various correction coefficients of values corresponding to the number N.

The timing generator 21c controls a timing at which the monitoring temperature Tsi measured by the temperature sensor 24 is read out and a voltage switching timing in a voltage source that applies the binary voltage (VDD and VSS) to the power supply line SRC. The timing generator 21c, for example, outputs a control pulse Pb to the ADC 21e immediately prior to the light emission, thereby causing the correction calculator 21a to output the digital monitoring temperature Tsi that is immediately prior to the light emission.

The DAC 21d converts the digital drive pulse Pc obtained by the correction calculator 21a into the analog drive pulse Pd. The DAC 21d outputs the analog drive pulse Pd obtained by the conversion to the gate of each of the switch devices Tr1. The DAC 21d outputs the drive pulse Pd generated for each switch device Tr1, for the gates of the respective switch devices Tr1 to which the common power supply line SRC is coupled.

The ADC 21e converts the analog monitoring temperature Tsi measured by the temperature sensor 24 into the digital monitoring temperature Tsi. The ADC 21e outputs the monitoring temperature Tsi to the correction calculator 21a, on the basis of the control pulse Pb inputted from the timing generator 21c. The ADC 21e converts the analog monitoring temperature Tsi that is immediately prior to the light emission into the digital monitoring temperature Tsi on the basis of the control pulse Pb inputted from the timing generator 21c, and outputs the converted monitoring temperature Tsi to the correction calculator 21a.

FIG. 5 illustrates a planar configuration example when the laser driver IC 20 is mounted on the printed wiring substrate 50. In the surface emission laser device 1, the printed wiring substrate 50 is provided with, in addition to the laser driver IC 20, the system controller 30 and the pulse generator 40, for example. FIG. 6 illustrates a cross-sectional configuration example taken along the line A-A of FIG. 5. A joining layer 53 is provided between the laser driver IC 20 and the printed wiring substrate 50. The joining layer 53 fixes the laser driver IC 20 and the printed wiring substrate 50 with respect to each other. The joining layer 53 includes, for example, an insulating resin material.

The laser driver IC 20 and the printed wiring substrate 50 are electrically coupled to each other by a bonding wire 54. One end of the bonding wire 54 is fixed to a connection pad 22c of the laser driver IC 20 by a solder 25. The other end of the bonding wire 54 is fixed to the connection pad 51 of the printed wiring substrate 50 by a solder 52.

(A) of FIG. 7, (A) of FIG. 8, and (A) of FIG. 9 each illustrate a state in which the plurality of emitters 12 structuring the emitter array 11 is divided into nine sections, and one temperature sensor 24 is provided for each section. (A) of FIG. 7 illustrates a state in which all the emitters 12 emit light. (A) of FIG. 8 and (A) of FIG. 9 each illustrate a state in which only a part of the emitters 12 emit light. (B) of FIG. 7, (B) of FIG. 8, and (B) of FIG. 9 each illustrate a state in which a correction coefficient Ck is allocated to each section of (A) of FIG. 7, (A) of FIG. 8, and (A) of FIG. 9. The correction coefficient Ck is used upon generating the drive pulse Pc described above. For example, values of the correction coefficient Ck are different for the respective sections (i.e., different depending on positions), and are different depending on the number of emitters 12 emitting light in the sections. Accordingly, the correction coefficient Ck is expressed as a mathematical function of the section (the position) and the number of emitters 12 emitting light in the section as variables.

(Current Correction Algorithm)

Next, the current correction algorithm in the laser driver IC 20 will be described. First, the junction temperature Tj(t) (the active layer temperature) will be described, followed by, as a comparative example, a correction current model using a thermal time constant (an ideal correction current model) and a correction current model according to the present embodiment (a simple correction current model).

FIG. 10 illustrates a simulation result of the junction temperature Tj(t) (the active layer temperature). FIG. 10 exemplifies, where 400 emitters are selected at approximately equal intervals out of the total of 800 emitters (20×40 at a 20 μm pitch), a temporal change of the junction temperature Tj(t) (the active layer temperature) when a current pulse of 6 mA with a pulse width of 4 ms and a duty ratio of 30% is applied to the selected 400 emitters.

It is possible to represent the change in the junction temperature Tj(t) (the active layer temperature) illustrated in FIG. 10 using the thermal time constant. For example, by using a plurality of thermal time constants as illustrated in FIG. 11, it is possible to describe the change in the junction temperature Tj(t) (the active layer temperature) illustrated in FIG. 10.

A light output is uniquely determined by a current to flow to the emitters and the junction temperature Tj(t) (the active layer temperature). For example, in the current correction algorithm that uses each of the thermal time constants illustrated in FIG. 11, a temporal change of a light output Po(t), when the current pulse (a basic current pulse) of 6 mA with the pulse width of 4 ms and the duty ratio of 30% is applied to the 400 emitters out of all 800 emitters, is illustrated in FIG. 12, for example.

In order to rectangularize the light output, it is necessary to superimpose, on the basic current pulse, the correction current pulse that is sufficient to compensate for a shortage of the light output. Although it depends on a structure of the emitter (an epi-structure or an OA diameter), in a case of a state where a thermal load is small and light is emitted solely, the light output is a 4 mW output when the current pulse of 6 mA is applied. Therefore, the correction current pulse necessary for multiple-light emission is represented by 4 mW-Po(t)/SEO(t), where SEO(t) is a slope-efficiency of the emitter at the time t in the absence of the correction current pulse. A result of this calculation is illustrated in FIG. 13.

When a resultant of the superimposition of the correction current pulse on the basic current pulse as illustrated in FIG. 13 is applied to the emitter, the junction temperature Tj (the active layer temperature) further rises due to the correction current pulse as illustrated in FIG. 14, for example. The light output at this time has not yet been rectangularized as illustrated by an arrow (a) in FIG. 15. Accordingly, an additional correction current is necessary. However, if the correction current is added several times, the light output becomes rectangular as illustrated by an arrow (b) in FIG. 15. The correction current pulse at this time is as illustrated in FIG. 16, for example.

In this manner, the correction current pulse for rectangularizing the light output (hereinafter, referred to as an "ideal correction current pulse") is obtained. However, because an enormous number of calculations are necessary to obtain the ideal correction current pulse, it is difficult to provide a circuit that performs such calculations in the laser driver IC 20. Accordingly, it is necessary to simplify a process of deriving the ideal correction current pulse. Therefore, a method of simplifying the process of deriving the ideal correction current pulse will be described below.

FIGS. 17 and 18 respectively illustrate waveforms of the 1st and 30th waves of the ideal correction current pulse, when 200 emitters are selected at approximately equal intervals out of the total of 800 emitters (20×40 at a 20 μm pitch) and the current pulse of 6 mA with the pulse width of 4 ms and the duty ratio of 30% is applied to the selected 200 emitters. FIGS. 19 and 20 respectively illustrate waveforms of the 1st and 30th waves of the ideal correction current pulse, when 400 emitters are selected at approximately equal intervals out of the total of 800 emitters (20×40 at a 20 μm pitch) and the current pulse of 6 mA with the pulse width of 4 ms and the duty ratio of 30% is applied to the selected 400 emitters.

Qualitatively, these waveforms can be described as follows.

1. The waveforms change at a "1-exp" close to the thermal time constant described in the thermal time constant model.
2. The correction current having the small time constant and immediately after the light emission is not significantly different between 200 emitters and 400 emitters.

This means that at the beginning of the light emission, a heat generated by the light emission in the surroundings is not yet conducted.

3. A correction current component in which the time constant is large is mainly changed when the number of emitters is changed.
4. In the change from the first wave to the thirtieth wave, all the time constant components become large.

This indicates that more correction current is necessary due to the increase in the active layer temperature.

From the above, it is possible to represent the correction current model as follows.

$$\sum_k C_k(N) \cdot F_k(T_j) \cdot [1 - \exp(-\tau/TA_k)] \qquad \text{[Numerical Expression 1]}$$

TAk: a kth current correction time constant
N: the number of light emission emitters
Ck(N): a coefficient that changes the correction amount depending on the number of light emission emitters
Tj: the junction temperature (the active layer temperature) immediately prior to the light emission
Fk(Tj): a coefficient that changes the correction amount by Tj As can be seen from the above expression, an initial value of the correction current is determined by the number of light emission emitters and the junction temperature Tj (the active layer temperature), and the correction current is increased in accordance with "1−exp(−t/TAk" as in the expression of the thermal increase.

Incidentally, in the present embodiment, the temperature sensor 24 is disposed on a surface layer of the laser driver IC 20, and a heat transfer time (the thermal time constant)

from each emitter 12 to the temperature sensor 24 is smaller than a pulse-off period (the pulse interval t1). Accordingly, when a pulse-off time (the pulse interval t1) elapses for several milliseconds, the junction temperature Tj(t) (the active layer temperature) drops to the monitoring temperature Tsi as illustrated in FIG. 21, for example. It can also be seen that a minimum value of the junction temperature Tj(t) (the active layer temperature) gradually increases in accordance with the envelope of the thermal time constant of 80 ms. However, because this change is static for one pulse, there is no necessity to deal with the change in the amount of light associated with the thermal time constant of 80 ms in the correction current expression (see FIG. 11).

Similarly, it is not necessary to include, in the correction current expression, a temperature change in a housing, because the temperature change is static with respect to the pulsed operation. Consequently, as for a temperature, it suffices that the monitoring temperature Tsi immediately prior to the light emission is known regardless of the temperature in the housing at that time. Therefore, the correction current expression is rewritten as follows.

$$\sum_k C_k(N) \cdot F_k(T_{si}) \cdot [1 - \exp(-\tau/TA_k)] \qquad \text{[Numerical Expression 2]}$$

The time constant of the correction current expression is considered to be the same as in value or close in value to thermal time constant. However, finely dividing these time constant components is complicated. Accordingly, the smallest time constant to be considered in operation is regarded as µs order. Therefore, the correction current coefficient and the time constant described below are handled only up to k=1, 2, and 3.

Next, the determination of the coefficients of the correction current expression will be described. It is necessary to make several assumptions for the simplest possible configuration. First, the following expression is assumed for the highest temperature where the monitoring temperature Tsi is expected for a use case. In doing so, C(N) (a coefficient that varies with the number of active emitters) can be said to be an amount of the correction current for each time constant reaching a thermal saturation (defined here as the thirtieth wave or later). When parameters are adjusted so that the numerical values derived from the correction current expression and the ideal current waveform obtained by the above method coincide with each other for each N, the numerical values illustrated in FIG. 22 are obtained.

$$F(T_{si}) = 1 \qquad \text{[Numerical Expression 3]}$$

When F(Tsi) is fixed to 1 as described above, the correction current becomes constant regardless of the order of occurrence of the pulse. Accordingly, a rectangular light waveform is obtained only in a thermal saturated condition (only in the latter pulse). An overcorrection occurs (see FIG. 23) in the first half of the pulses where the junction temperature Tj(t) (the active layer temperature) is low. For this issue, it is the F(Tsi) function that corrects the light waveform from the start of pulse input until the thermal saturation. The F(Tsi) function that makes it possible to approach the ideal correction current can be approximately expressed by a quadratic function. At the highest temperatures during operation (here Tsi=75° C.), Fk(Tsi) corresponding to all the time constants (k=1, 2, 3) is parabolic through 1. In addition, no droop occurs when the temperature becomes lower than a certain temperature, and Fk(Tsi) becomes a constant value. To summarize the discussion so far, it is possible to generalize the correction current expression and the coefficients that structure the correction current expression as follows. By adjusting Fk(Tsi) in the following expressions, the rectangular light waveform as illustrated by way of example in FIG. 24 is obtained.

$$\sum_{k=1}^{3} C_k(N) \cdot F_k(T_{si}) \cdot [1 - \exp(-\tau/TA_k)] \qquad \text{[Numerical Expression 4]}$$

$$F_k(T_{si}) = \begin{cases} \alpha_k(T_{si} - \beta_k)^2 + \gamma_k & \cdots (T_{si} \geq X_k) \\ Y_k & \cdots (T_{si} < X_k) \end{cases} \qquad \text{[Numerical Expression 5]}$$

[Driving Method]

In the surface emission laser device 1 having the configuration described above, the laser driver 1C 20 simultaneously drives a part of the emitters 12 included in the emitter array 11 so as to achieve the light emission profile illustrated in FIG. 8 or 9, for example.

At this time, the laser driver 1C 20 generates the plurality of drive pulses Pc to be sequentially outputted to each of the emitters 12 selected as the light-emission targets, on the basis of the number N of emitters 12 selected as the light-emission targets and the monitoring temperature Tsi that is immediately prior to the light emission of each of the emitters 12 selected as the light-emission targets, at the pulse interval t1 that is equal to or greater than a time necessary for the monitoring temperature Tsi and the junction temperature Tj(t) (the active layer temperature) to coincide after the light emission. Specifically, the laser driver IC 20 generates the correction current pulse on the basis of the expressions described in the two preceding paragraphs, and superimposes the generated correction current pulse on the rectangular basic current pulse Pa generated by the pulse generator 40, thereby generating the drive pulse Pc. The laser driver IC 20 outputs, via the DAC 21d, the plurality of generated drive pulses Pc to each of the emitters 12 selected as the light-emission targets, at the pulse interval t1. The laser driver IC 20 converts the plurality of generated drive pulses Pc into the analog drive pulses Pd and outputs the converted drive pulses to each of the emitters 12 selected as the light-emission targets, at the pulse interval t1.

[Effect]

Next, effects of the surface emission laser device 1 according to the present embodiment will be described.

In the field of a laser array in which a plurality of surface emission lasers is formed on the same substrate, there is an issue in that a light emission intensity is lowered due to a thermal crosstalk when the plurality of surface emission lasers emits light at the same time.

In contrast, in the present embodiment, the plurality of drive pulses Pd to be sequentially outputted to each of the emitters 12 selected as the light-emission targets is generated on the basis of the number N of the emitters 12 as the light-emission targets and the monitoring temperature Tsi. As a result, the plurality of drive pulses Pd considering the thermal crosstalk when the plurality of emitters emits light simultaneously is generated. Here, the plurality of drive pulses Pd is outputted to each of the emitters 12 selected as the light-emission targets, at the pulse interval t1 that is equal to or greater than a time necessary for the monitoring temperature Tsi and the junction temperature Tj(t) (the active layer temperature) to coincide after the light emission. This eliminates the necessity to consider a thermal history caused by the previous drive pulse Pd upon generating the drive pulses Pd. In addition, for example, by measuring the monitoring temperature Tsi by the temperature sensor 24 disposed at the position at which the thermal time constant τ from the active layer 12D of each of the emitters 12 becomes shorter than the pulse interval t1, it is possible to substantially measure the junction temperature Tj(t) of the emitter 12. Accordingly, it is possible to accurately measure the junction temperature Tj(t) of the emitter 12. As a result, it is possible to suppress the decrease in the light emission intensity caused by the thermal crosstalk.

As described above, in the laser light outputted from each of the emitters 12, instability of the light output due to a heat is suppressed. Accordingly, for example, by causing the laser light outputted from each of the emitters 12 to be reflected by the human face and detecting the light reflected by the human face by a CMOS image sensor, it is possible to perform a stable face authentication with a reduced authentication error.

Further, in the present embodiment, the pulse interval t1 is on the order of milliseconds. This eliminates the necessity to consider a thermal history caused by the previous drive pulse Pd upon generating the drive pulses Pd. In addition, for example, by measuring the monitoring temperature Tsi by the temperature sensor 24 disposed at the position at which the thermal time constant τ from the active layer 12D of each of the emitters 12 becomes shorter than the pulse interval t1, it is possible to substantially measure the junction temperature Tj(t) of the emitter 12. Accordingly, it is possible to accurately measure the junction temperature Tj(t) of the emitter 12. Hence, it is possible to perform a stable face authentication with a reduced authentication error.

Further, in the present embodiment, the monitoring temperature Tsi is measured by the temperature sensor 24 disposed at the position at which the thermal time constant τ from the active layer 12D of each of the emitters 12 becomes shorter than the pulse interval t1. Thus, it is possible to substantially measure the junction temperature Tj(t) of the emitter 12. As a result, it is possible to accurately measure the junction temperature Tj(t) of the emitter 12. Hence, it is possible to perform a stable face authentication with a reduced authentication error.

Further, in the present embodiment, because the correction current model described above is implemented in the laser driver IC 20, the drive pulses Pd are correctly outputted on the basis of the various monitoring temperatures Tsi and the various numbers of light emission emitters. For example, FIG. 25 illustrates a correction accuracy of light waveforms when a backside temperature Tbs of the laser driver IC 20 is varied from −10° C. to 40° C. and the number of light emission emitters is changed from 200, 300, to 400 for each temperature condition. A horizontal axis illustrates the time when one pulse (Pw=4 ms/Duty 30%) is focused, and a vertical axis illustrates an error for an ideal light output of 4 mW. As illustrated in this drawing, it can be seen that the correction current accuracy is suppressed to about 2% no matter how monitoring temperature Tsi is changed or the number of light emission emitters is changed. In addition, FIG. 26 illustrates a result of performing similar evaluations on the emitters 12 at the peripheral portion. Although only a parameter of Ck(N) is finely adjusted, the correction accuracy is similarly suppressed to about 2%. Therefore, it is possible to perform a stable face authentication with a reduced authentication error, regardless of a temperature environment and setting of the number of light emission emitters.

2. Modification Examples

Next, modification examples of the surface emission laser device 1 according to the above embodiment will be described.

Modification Example A

FIG. 27 illustrates a planar configuration example when the laser chip 10 is disposed on a temperature sensor unit 60. FIG. 28 illustrates a cross-sectional configuration example taken along the line A-A of FIG. 27. In the surface emission laser device 1 according to the above embodiment, for example, the laser chip 10 may be disposed on the temperature sensor unit 60 instead of the laser driver IC 20 as illustrated in FIGS. 27 and 28. At this time, the laser driver IC 20 is mounted at a position, of the surface of the printed wiring substrate 50, not facing the laser chip 10. The temperature sensor unit 60 has, for example, a Si-substrate 61 and a wiring line layer 62 provided on the Si-substrate 61. The plurality of temperature sensors 24 is formed on the Si-substrate 61. The wiring line layer 62 has a configuration similar to that of the wiring line layer 22 according to the above embodiment.

Each temperature sensor 24 is disposed at a position, of the Si-substrate 21, that is opposed to the laser chip 10. Each temperature sensor 24 is further disposed at a position at which the thermal time constant τ between the active layer 12D of each emitter 12 and each temperature sensor 24 becomes shorter than the pulse interval t1. Each temperature sensor 24 is further disposed at a position at which the thermal time constant τ becomes shorter than t1-t2. Accordingly, it is possible for the surface emission laser device 1 according to the present modification example to achieve an effect similar to those of the embodiment described above.

Modification Example B

FIG. 29 illustrates a planar configuration example when the laser chip 10 is disposed on a temperature sensor unit 70. FIG. 30 illustrates a cross-sectional configuration example taken along the line A-A of FIG. 29. In the surface emission laser device 1 according to the above embodiment, for example, the laser chip 10 may be disposed on the temperature sensor unit 70 instead of the laser driver IC 20 as illustrated in FIGS. 29 and 30. At this time, the laser driver IC 20 is mounted at a position, of the surface of the printed wiring substrate 50, not facing the laser chip 10. The temperature sensor unit 70 has, for example, a heat sink 71 (a structure) and a wiring line layer 72 provided on the heat sink 71. The plurality of temperature sensors 24 is formed in the wiring line layer 72. The temperature sensor 24 is configured by a thermal device such as a thermistor, for example.

Each temperature sensor 24 is disposed at a position, of the wiring line layer 72, that is opposed to the laser chip 10. Each temperature sensor 24 is further disposed at a position at which the thermal time constant τ between the active layer 12D of each emitter 12 and each temperature sensor 24 becomes shorter than the pulse interval t1. Each temperature sensor 24 is further disposed at a position at which the thermal time constant τ becomes shorter than t1-t2. Accordingly, it is possible for the surface emission laser device 1 according to the present modification example to achieve an effect similar to those of the embodiment described above.

Modification Example C

FIG. 31 illustrates a modification example of a planar configuration of the surface emission laser device 1 according to the first embodiment. FIG. 32 illustrates a cross-sectional configuration example taken along the line A-A of FIG. 31.

In the first embodiment, the emitter array 11 is formed on the surface on the printed wiring substrate 50 side of the substrate 14. However, for example, the emitter array 11 may be formed on a surface, of substrate 14, on the opposite side of the printed wiring substrate 50, as illustrated in FIG. 32. At this time, the laser chip 10 may be mounted on the printed wiring substrate 50. At this time, the laser chip 10 is fixed to the printed wiring substrate 50 by a joining layer 55, for example, as illustrated in FIG. 32. The joining layer 55 is configured by, for example, a conductive solder. In this case, the n-type semiconductor substrate of the substrate 14 has the same potential as the reference potential of the laser driver IC 20 through, for example, the printed wiring substrate 50.

In the present modification example, for example, as illustrated in FIG. 33, each emitter 12 has a columnar vertical resonator structure formed by stacking the contact layer 12A, the DBR layer 12B, the spacer layer 12C, the active layer 12D, the spacer layer 12E, the current confining layer 12F, the DBR layer 12G, and the contact layer 12J in this order. In the present modification example, each emitter 12 is, for example, obtained by removing a semiconductor substrate from a resultant that is obtained by forming the above vertical resonator structure by a crystal growth on a separately prepared semiconductor substrate. The contact layer 12A is electrically coupled to, for example, the n-type semiconductor substrate of the substrate 14.

Each emitter 12 further has an annular electrode layer 12K on an upper surface of the contact layer 12J, for example, as illustrated in FIG. 33. Each emitter 12 outputs laser light from a portion, of the upper surface of the contact layer 12J, exposed in an opening of the electrode layer 12K. The electrode layer 12K is formed by stacking, for example, a Ti layer, a Pt layer, and an Au layer in this order, and is electrically coupled to the contact layer 12J. The electrode layer 12K is coupled to a connection pad 26 via, for example, a metal wiring line. The connection pad 26 and the metal wiring line coupled to the connection pad 26 are formed on a surface, of the substrate 14, on the opposite side of the printed wiring substrate 50, and is insulated and separated from the n-type semiconductor substrate of the substrate 14. The connection pad 26 is coupled to, for example, a bonding wire 27. One end of the bonding wire 27 is coupled to the connection pad 26, and the other end of the bonding wire 27 is coupled to the connection pad 22C provided at the laser driver IC 20. The electrode layer 12K is coupled to the switch device Tr1 in the laser driver IC 20.

In the present modification example, one or a plurality of temperature sensors 24 is provided in the laser chip 10. The one or the plurality of temperature sensors 24 is configured by, for example, a photodiode or a poly-silicon resistor. The one or the plurality of temperature sensors 24 is formed, for example, on a surface, of the substrate 14, on the opposite side of the printed wiring substrate 50. For example, the one or the plurality of temperature sensors 24 is disposed around the emitter array 11 on a surface, of the substrate 14, on the opposite side of the printed wiring substrate 50. Note that the one or the plurality of temperature sensors 24 may be disposed inside the emitter array 11 on the surface, of substrate 14, on the opposite side of the printed wiring substrate 50. The one or the plurality of temperature sensors 24 is coupled to the connection pad 26 via, for example, a metal wiring line.

The one or the plurality of temperature sensors 24 is further disposed at a position at which the thermal time constant $\tau$ between the active layer 12D of each emitter 12 and the temperature sensor 24 becomes shorter than the pulse interval t1. The thermal time constant $\tau$ refers to, for example, the time necessary for a temperature difference between the active layer 12D of each emitter 12 and the one or the plurality of temperature sensors 24 to become 1/e. The one or the plurality of temperature sensors 24 is further disposed at a position at which the thermal time constant $\tau$ becomes shorter than t1-t2. Note that t2 is the period t2 at which the monitoring temperature Tsi is read from the temperature sensor 24 immediately prior to the light emission. This allows the one or the plurality of temperature sensors 24 to measure a temperature that is equal to or substantially equal to the junction temperature Tj(t) (the active layer temperature) that is immediately prior to the light emission of each emitter 12.

In the present modification example, the arrangement of the temperature sensor 24 is changed so that a positional relationship between the emitter array 11 and the temperature sensor 24 becomes similar to the positional relationship in the above embodiment in terms of the thermal time constant $\tau$, in accordance with the change in the arrangement of the emitter array 11. Further, in the present modification example, a configuration of each emitter 12 and a manner of coupling each emitter 12 and the laser driver IC 20 are changed so that it is possible to drive each emitter 12 independently. Accordingly, it is possible for the present modification example to achieve an effect similar to those of the embodiment described above.

Modification Example D

In the surface emission laser device 1 according to the foregoing embodiment and its modification examples, the plurality of emitters 12 structuring the emitter array 11 is divided into nine sections, but the number of sections of the plurality of emitters 12 is not limited to nine. Further, in the surface emission laser device 1 according to the foregoing embodiment and its modification examples, although one temperature sensor 24 is provided for each section, only one temperature sensor 24 may be provided for the surface emission laser device 1. In this case, it is preferable that temperatures of locations, of the laser driver IC 20, the temperature sensor unit 60, and the temperature sensor unit 70, facing the emitter array 11 be negligibly uniform in terms of the current correction.

While present technology has been described with reference to the embodiments, the present technology is not limited to the above embodiments, and various modifications can be made. It should be noted that the effects described herein are only exemplified. The effects of the present technology are not limited to the effects described herein. The present technology may have effects other than the effects described herein.

For example, the present technology may also be configured as follows.

(1)
A surface emission laser driving method including:
generating a plurality of drive pulses to be sequentially outputted to, out of a plurality of surface emission lasers disposed on a same substrate, each of the surface emission lasers selected as light-emission targets, on the basis of the number of surface emission lasers selected as the light-emission targets and a monitoring temperature that is immediately prior to light emission of each of the surface emission lasers selected as the light-emission targets; and outputting the plurality of generated drive pulses to each of the surface emission lasers selected as the light-emission targets.

(2)

The surface emission laser driving method according to (1), in which a pulse interval of the plurality of drive pulses is on order of milliseconds.

(3)

The surface emission laser driving method according to (1) or (2), in which the monitoring temperature is measured by a temperature sensor that is disposed at a position at which a thermal time constant from an active layer of each of the surface emission lasers becomes shorter than the pulse interval.

(4)

A surface emission laser device including:

a plurality of surface emission lasers disposed on a same substrate; and a drive circuit that drives the plurality of surface emission lasers, in which the drive circuit generates a plurality of drive pulses to be sequentially outputted to, out of the plurality of surface emission lasers, each of the surface emission lasers selected as light-emission targets, on the basis of the number of surface emission lasers selected as the light-emission targets and a monitoring temperature that is immediately prior to light emission of each of the surface emission lasers selected as the light-emission targets, and thereafter outputs the plurality of generated drive pulses to each of the surface emission lasers selected as the light-emission targets.

(5)

The surface emission laser device according to (4), in which a pulse interval of the plurality of drive pulses is on order of milliseconds.

(6)

The surface emission laser device according to (4) or (5), further including a temperature sensor that is disposed at a position at which a thermal time constant from an active layer of each of the surface emission lasers becomes shorter than the pulse interval, and measures the monitoring temperature.

According to the surface emission laser driving method and the surface emission laser device of one embodiment of the present technology, the plurality of drive pulses to be sequentially outputted to each of the surface emission lasers selected as the light-emission targets is generated on the basis of the number of surface emission lasers as the light-emission targets and the monitoring temperature. Hence, it is possible to suppress the decrease in the light emission intensity caused by the thermal crosstalk. It should be noted that the effects of the present disclosure are not necessarily limited to the effects described here, and may be any of the effects described herein.

The present application claims the benefit of Japanese Priority Patent Application JP2018-215382 filed with the Japan Patent Office on Nov. 16, 2018, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A surface emission laser driving method comprising:

generating a plurality of drive pulses to be sequentially outputted to, out of a plurality of surface emission lasers disposed on a same substrate, each of the surface emission lasers selected as light-emission targets, on a basis of the number of surface emission lasers selected as the light-emission targets and a monitoring temperature that is immediately prior to light emission of each of the surface emission lasers selected as the light-emission targets; and outputting the plurality of generated drive pulses to each of the surface emission lasers selected as the light-emission targets, wherein the monitoring temperature is measured by a temperature sensor that is disposed at a position at which a thermal time constant from an active layer of each of the surface emission lasers becomes shorter than a pulse interval of the plurality of drive pulses.

2. The surface emission laser driving method according to claim 1, wherein the pulse interval of the plurality of drive pulses is on order of milliseconds.

3. A surface emission laser device comprising:

a plurality of surface emission lasers disposed on a same substrate;

a drive circuit that drives the plurality of surface emission lasers; and a temperature sensor, wherein the drive circuit generates a plurality of drive pulses to be sequentially outputted to, out of the plurality of surface emission lasers, each of the surface emission lasers selected as light-emission targets, on a basis of the number of surface emission lasers selected as the light-emission targets and a monitoring temperature that is immediately prior to light emission of each of the surface emission lasers selected as the light-emission targets, and thereafter outputs the plurality of generated drive pulses to each of the surface emission lasers selected as the light-emission targets, the temperature sensor is disposed at a position at which a thermal time constant from an active layer of each of the surface emission lasers becomes shorter than a pulse interval of the plurality of drive pulses, and the temperature sensor measures the monitoring temperature.

4. The surface emission laser device according to claim 3, wherein the pulse interval of the plurality of drive pulses is on order of milliseconds.

* * * * *